(12) United States Patent
Ruan et al.

(10) Patent No.: US 12,573,673 B2
(45) Date of Patent: Mar. 10, 2026

(54) BATTERY CHARGE AND DISCHARGE TEST APPARATUS

(71) Applicant: CONTEMPORARY AMPEREX TECHNOLOGY (HONG KONG) LIMITED, Hong Kong (CN)

(72) Inventors: Keyu Ruan, Ningde (CN); Lixin Guo, Ningde (CN); Shaoteng Ren, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 197 days.

(21) Appl. No.: 18/473,306

(22) Filed: Sep. 25, 2023

(65) Prior Publication Data

US 2024/0145796 A1 May 2, 2024

Related U.S. Application Data

(63) Continuation of application No. PCT/CN2023/085238, filed on Mar. 30, 2023.

(30) Foreign Application Priority Data

Oct. 27, 2022 (CN) .......................... 202222849415.9

(51) Int. Cl.
*H01M 10/42* (2006.01)
*G01R 31/36* (2020.01)
(Continued)

(52) U.S. Cl.
CPC ...... *H01M 10/4285* (2013.01); *G01R 31/364* (2019.01); *G01R 31/3644* (2013.01);
(Continued)

(58) Field of Classification Search
CPC ............ H01M 10/4285; H01M 10/441; G01R 31/3865; G01R 31/364; G01R 31/3644; H02J 7/00309; H02J 7/0045; H02J 7/0013
(Continued)

(56) References Cited

U.S. PATENT DOCUMENTS 5,903,154 A 5/1999 Zhang et al.
5,914,609 A 6/1999 Curry et al.
(Continued)

FOREIGN PATENT DOCUMENTS

CN 105024100 A 11/2015
CN 105190986 A 12/2015
(Continued)

OTHER PUBLICATIONS

Extended European Search Report issued to related EP Patent Application No. 23733827.2, dated Nov. 11, 2024, 8 pages.
(Continued)

*Primary Examiner* — Huy Q Phan
*Assistant Examiner* — Trung Q Nguyen
(74) *Attorney, Agent, or Firm* — K&L Gates LLP

(57) ABSTRACT

Disclosed are a battery charge and discharge test apparatus including a temperature control box, a frame, at least one partition, and a plurality of charge and discharge modules. The temperature control box is provided with a plurality of test chambers, and openings are provided on a first side of the temperature control box for communicating with the test chambers respectively and taking and placing batteries. The frame is disposed adjacent to a second side of the temperature control box, and the at least one partition is located inside the frame to partition the frame into a plurality of accommodating chambers. The first side and the second side are opposite each other. The plurality of charge and dis- (Continued)

charge modules are disposed in the plurality of accommo-
dating chambers respectively and configured to charge and
discharge the batteries in the corresponding test chambers.

18 Claims, 7 Drawing Sheets

(51) Int. Cl.

| | |
|---|---|
| *G01R 31/364* | (2019.01) |
| *G01R 31/385* | (2019.01) |
| *H01M 10/44* | (2006.01) |
| *H02J 7/00* | (2006.01) |

(52) U.S. Cl.
CPC ...... *G01R 31/3865* (2019.01); *H01M 10/441*
(2013.01); *H02J 7/00309* (2020.01); *H02J*
*7/0045* (2013.01); *H02J 7/0013* (2013.01)

(58) Field of Classification Search
USPC ..................... 324/500, 600, 76.11, 425–431
See application file for complete search history.

(56) References Cited

U.S. PATENT DOCUMENTS

| | | | | |
|---|---|---|---|---|
| 10,950,900 | B2 * | 3/2021 | Hahn | H01M 6/5083 |
| 11,885,851 | B2 * | 1/2024 | Kim | H01M 50/244 |
| 2012/0276430 | A1 | 11/2012 | Witting | |
| 2013/0141107 | A1 | 6/2013 | Yuasa | |
| 2015/0194707 | A1 | 7/2015 | Park | |
| 2020/0064407 | A1 * | 2/2020 | Zhang | G01R 31/371 |
| 2021/0020260 | A1 * | 1/2021 | Tsai | G11C 29/56016 |
| 2022/0231346 | A1 * | 7/2022 | Chae | H01M 10/4285 |
| 2023/0194613 | A1 | 6/2023 | Kaneko | |
| 2024/0111647 | A1 | 4/2024 | Nam et al. | |
| 2024/0145796 | A1 | 5/2024 | Ruan et al. | |
| 2024/0186667 | A1 * | 6/2024 | Do | H01M 10/425 |
| 2024/0230764 | A1 | 7/2024 | Li et al. | |
| 2025/0028004 | A1 | 1/2025 | Hyun | |

FOREIGN PATENT DOCUMENTS

| | | | |
|---|---|---|---|
| CN | 207542354 | U | 6/2018 |
| CN | 108490367 | A | 9/2018 |
| CN | 109541477 | A | 3/2019 |
| CN | 208888351 | U | 5/2019 |
| CN | 209979684 | U | 1/2020 |
| CN | 110794318 | A | 2/2020 |
| CN | 211062810 | U | 7/2020 |
| CN | 211653026 | U | 10/2020 |
| CN | 211718477 | U | 10/2020 |
| CN | 111948550 | A | 11/2020 |
| CN | 212031673 | U | 11/2020 |
| CN | 212321669 | U | 1/2021 |
| CN | 112557934 | A | 3/2021 |
| CN | 212808360 | U | 3/2021 |
| CN | 112803093 | A | 5/2021 |
| CN | 113540632 | A | 10/2021 |
| CN | 214622978 | U | 11/2021 |
| CN | 215297614 | U | 12/2021 |
| CN | 215415796 | U | 1/2022 |
| CN | 215768925 | U | 2/2022 |
| CN | 215986169 | U | 3/2022 |
| CN | 216117702 | U | 3/2022 |
| CN | 216411514 | U | 4/2022 |
| CN | 114552735 | A | 5/2022 |
| CN | 114768910 | A | 7/2022 |
| CN | 114787639 | A | 7/2022 |
| CN | 115207553 | A | 10/2022 |
| CN | 217587444 | U | 10/2022 |
| CN | 217639162 | U | 10/2022 |
| CN | 115485921 | A | 12/2022 |
| CN | 218956652 | U | 5/2023 |
| DE | 102024129523 | A1 | 12/2024 |
| EP | 2388845 | A1 | 11/2011 |
| EP | 2993725 | A1 | 3/2016 |
| EP | 4184653 | A1 | 5/2023 |
| EP | 4386405 | A1 | 6/2024 |
| JP | 2013145131 | A | 7/2013 |
| JP | 5769640 | B2 | 8/2015 |
| JP | 2022108378 | A | 7/2022 |
| KR | 20130000598 | A | 1/2013 |
| KR | 101519708 | B1 | 5/2015 |
| KR | 20200015066 | A | 2/2020 |
| TW | 201211567 | A | 3/2012 |
| WO | 2022167955 | A1 | 8/2022 |

OTHER PUBLICATIONS

International Search Report received in the corresponding Interna-
tional Application PCT/CN2023/085238, mailed Jul. 21, 2023.
The partial European Search Report received in the counterpart
European Application 23220667.2, mailed on Jul. 15, 2024.
The Non-Final Office Action received in the corresponding U.S.
Appl. No. 18/219,275, dated Mar. 13, 2025, 19 pages.
The Non-Final Office Action received in the corresponding U.S.
Appl. No. 19/086,173, dated Apr. 23, 2025, 11 pages.
The extended European search received in the corresponding EP
application 23734892.5, dated Apr. 3, 2025, 8 pages.
The International Search Report received in the counterpart Inter-
national Application PCT/CN2023/082924, mailed on Oct. 7, 2023.
The International Search Report received in the counterpart Inter-
national Application PCT/CN2023/120967, mailed on Nov. 20,
2023.
Notice of Allowance, mailed Jul. 29, 2025, for U.S. Appl. No.
19/086,173.
The Non-Final Office Action received in the corresponding U.S.
Appl. No. 18/396,658, dated Oct. 22, 2025, 31 pages.

* cited by examiner

BATTERY CHARGE AND DISCHARGE TEST APPARATUS

CROSS-REFERENCE TO RELATED APPLICATION

The present application is a continuation of International Application No. PCT/CN2023/085238, filed on Mar. 30, 2023, which claims priority to Chinese patent application 202222849415.9, filed on Oct. 27, 2022 and entitled "BATTERY CHARGE AND DISCHARGE TEST APPARATUS", the entire contents of which are incorporated herein by reference.

TECHNICAL FIELD

This application pertains to the field of battery test technologies, and specifically, relates to a battery charge and discharge test apparatus.

BACKGROUND

Energy conservation and emission reduction are crucial to the sustainable development of the automobile industry. Electric vehicles, with their advantages in energy conservation and environmental protection, have become an important part of the sustainable development of the automobile industry. For electric vehicles, battery technology is an important factor in connection with their development.

During charging and discharging of the battery, the battery cell may swell and thus affects safety performance of the battery. In addition, with the charge and discharge cycles of the battery, the electrolyte is continuously consumed, which affects service life of the battery. Therefore, after the battery is manufactured, it is necessary to test the performance of the battery, especially the charging and discharging stability of the battery at different temperatures.

SUMMARY

This application provides a battery charge and discharge test apparatus so as to alleviate the problem of low integration level and large occupied space of the battery charge and discharge test apparatus.

To solve the foregoing technical problem, a technical solution used in this application is to provide a battery charge and discharge test apparatus including: a temperature control box, where the temperature control box is provided with a plurality of test chambers, and openings are provided on a first side of the temperature control box for communicating with the test chambers respectively and taking and placing batteries; a frame and at least one partition, where the frame is disposed adjacent to a second side of the temperature control box, and the at least one partition is located inside the frame to partition the frame into a plurality of accommodating chambers; the first side and the second side being opposite each other; and a plurality of charge and discharge modules, where the plurality of charge and discharge modules are disposed in the plurality of accommodating chambers respectively and configured to charge and discharge the batteries in the corresponding test chambers. In the foregoing design manner, space on the second side of the temperature control box can be fully used to integrate the charge and discharge modules and the temperature control box as a whole, with no need for additional space to place the charge and discharge modules, thereby improving utilization of laboratory space. In addition, in the foregoing design manner, the plurality of accommodating chambers partitioned by the partition and the frame are used to place the plurality of charge and discharge modules, which can standardize the arrangement of the plurality of charge and discharge modules and avoid mutual squeeze when adjacent charge and discharge modules are stacked, thereby improving service life of the charge and discharge modules.

The frame includes a plurality of fixed positions spaced apart from each other, and the partition is detachably connected to the fixed position so that volume of the accommodating chamber is able to be changed by changing a fixed position of the partition relative to the frame. In the foregoing design manner, the volume of the accommodating chamber can be adjusted adaptively according to volume of the charge and discharge module, so as to improve applicability of the battery charge and discharge test apparatus.

The battery charge and discharge test apparatus further includes a support assembly, where the support assembly is detachably connected to the fixed position, the support assembly forms a slide, and the partition is able to slide along the slide. In the foregoing design manner, the partition is detachably connected to the frame via the support assembly, making the structural design simple; and the support assembly forming the slide can reduce difficulty of taking or placing the partition.

The support assembly includes a first support member and a second support member. The first support member includes a first connecting portion and a first support portion angled to each other, and the first connecting portion is detachably connected to the fixed position. The second support member includes a second connecting portion and a second support portion angled to each other. The second connecting portion and the first connecting portion are attached to and connected to each other, and the second support portion and the first support portion face each other and are spaced apart from each other to form the slide. The support assembly has a simple structural design and is easy to assemble.

In the direction of gravity of the partition, the first support portion is located on a lower side of the partition and supports the partition, and the second support portion is located on an upper side of the partition and restricts the partition along a direction opposite the direction of gravity; and in an extending direction of the slide, a length of the second support portion is less than a length of the first support portion. In the foregoing design manner, frictional force on the partition when the partition slides along the slide can be reduced, reducing the difficulty of taking or placing the partition on the slide.

The fixed position includes a threaded hole; and/or the frame includes two side walls opposite each other, where each of the side walls is provided with a plurality of fixed positions, one fixed position on one side wall and one fixed position on the other side wall form a fixed position group, and the partition is bridged between the two side walls via one fixed position group. Such design manner is simple and easy for assembly.

The partition is provided with a plurality of via holes of different specifications, and the charge and discharge module is connected to the partition via at least one of the via holes. In the foregoing design manner, the probability of tilting and misalignment of the charge and discharge module can be reduced.

A first hollow carved region is provided on a side of the frame facing away from the test chamber, the charge and discharge module includes an operating interface, and the operating interface is exposed from the first hollow carved region. In the foregoing design manner, the testers can easily operate the charge and discharge module.

The battery charge and discharge test apparatus further includes a driving member, connecting posts, and connecting terminals; where the driving member is disposed in the accommodating chamber, the connecting post is electrically connected to the charge and discharge module and extends from the accommodating chamber through a side wall of the temperature control box into the test chamber, and the connecting terminal is disposed in the test chamber and configured to be electrically connected to the battery; and in an axial direction of the connecting post, the connecting post and the connecting terminal correspond to each other, the driving member is able to drive the connecting post to approach the connecting terminal along the axial direction of the connecting post to come into contact with the connecting terminal, and the driving member is able to drive the connecting post to leave the connecting terminal along the axial direction of the connecting post to separate from the connecting terminal. The foregoing manner of controlling connection and disconnection between the charge and discharge module and the battery via the driving member, the connecting post, and the connecting terminal is simple and highly automated.

The number of connecting posts is two, and the battery charge and discharge test apparatus further includes a first adapter assembly; where the two connecting posts are fastened side by side to the first adapter assembly, and the driving member is connected to the first adapter assembly and drives the two connecting posts to move synchronously via the first adapter assembly. In the foregoing design manner, automation control and test efficiency can be improved.

The connecting post is penetratedly fastened to the first adapter assembly, and the connecting post includes a first end exposed from a side of the first adapter assembly facing away from the test chamber; and the battery charge and discharge test apparatus further includes a fastener sleeved around the periphery of the first end and pressing a wire between the fastener and the first adapter assembly, where the wire is configured to electrically connect the charge and discharge module and the connecting post. The foregoing manner of electrically connecting the connecting post and the battery charge and discharge module is simple and has high stability.

The battery charge and discharge test apparatus further includes at least one second adapter assembly, first detection terminal, and second detection terminal located in the test chamber, where the second adapter assembly is bridged between the two connecting posts, the first detection terminal is disposed on the second adapter assembly, the first detection terminal comes into contact with the second detection terminal as the connecting post approaches the connecting terminal, and the first detection terminal separates from the second detection terminal as the connecting post leaves the connecting terminal. In the foregoing design manner, automation can be improved and driving energy can be saved.

The battery charge and discharge test apparatus further includes a bearing assembly located in the test chamber, where the bearing assembly includes a first bearing member and a second bearing member connected to and angled to each other, the first bearing member is configured to bear the battery, and the connecting terminal and the second detection terminal are disposed on the second bearing member. In the foregoing design manner, automation can be improved and driving energy can be saved.

The battery charge and discharge test apparatus further includes a water collecting tank, where the water collecting tank is disposed on a side of the side wall of the temperature control box facing away from the test chamber and located below the connecting post. In the foregoing design manner, the water collecting tank can be used to collect condensed water so as to reduce influence of the condensed water on the wire and the like.

The battery charge and discharge test apparatus further includes: a wire configured to electrically connect the charge and discharge module and the connecting post; and a wire arranging member, where the wire arranging member is disposed on the side of the side wall of the temperature control box facing away from the test chamber, and the wire penetrates the wire arranging member. In the foregoing design manner, the wire arranging member introduced can make regular wiring.

The frame includes a thickness direction, width direction, and height direction perpendicular to each other, and the thickness direction is parallel to a direction from the first side to the second side; where in the height direction of the frame, the frame includes an upper portion and a lower portion opposite each other; and the battery charge and discharge test apparatus further includes: a temperature control module configured to control temperature of the test chamber, where at least part of the temperature control module is disposed in the frame and located on the lower portion of the frame; and an electrical control module electrically connected to the temperature control module and the charge and discharge module, where the electrical control module and the charge and discharge module are disposed on an upper portion of the temperature control module, and the electrical control module and the charge and discharge module are disposed side by side along the width direction. The temperature control module, the electrical control module, and the charge and discharge module are all located on the second side of the temperature control box, with a reasonable spatial layout and high integration level.

The frame has a second hollow carved region on a side of the accommodating chamber facing away from the electrical control module, and the battery charge and discharge test apparatus further includes a cover plate configured to cover the second hollow carved region; where the cover plate is provided with a plurality of heat dissipation holes. In the foregoing design manner, the probability of the wire being exposed from the second hollow carved region can be reduced, so as to make a good visual effect. In addition, the heat dissipation holes introduced are conducive to heat dissipation of the charge and discharge module, thereby improving the service life of the charge and discharge module.

The cover plate includes two side edges opposite each other, with one side edge being pivotally connected to the frame and the other side edge being provided with a lock fastener, where the lock fastener is configured to restrict pivot rotation of the cover plate relative to the frame in a locked state. In the foregoing design manner, maintenance by workers is made easy.

A third hollow carved region is provided on a side of the upper portion of the frame facing away from the lower portion, the battery charge and discharge test apparatus further includes a sealing plate, and the sealing plate covers at least the third hollow carved region. In the foregoing design manner, the probability of external rainwater and the like entering the charge and discharge test apparatus can be reduced, thereby improving the service life of the charge and discharge test apparatus.

The foregoing description is merely an overview of the technical solution of this application. For a better understanding of the technical means in this application such that they can be implemented according to the content of the specification, and to make the above and other objectives, features, and advantages of this application more obvious and easier to understand, the following describes specific embodiments of this application.

BRIEF DESCRIPTION OF DRAWINGS

To describe the technical solutions in the embodiments of this application more clearly, the following briefly describes the accompanying drawings required for describing the embodiments. Apparently, the accompanying drawings in the following description show only some embodiments of this application, and persons of ordinary skill in the art may still derive other drawings from these accompanying drawings without creative efforts.

Figure 1:
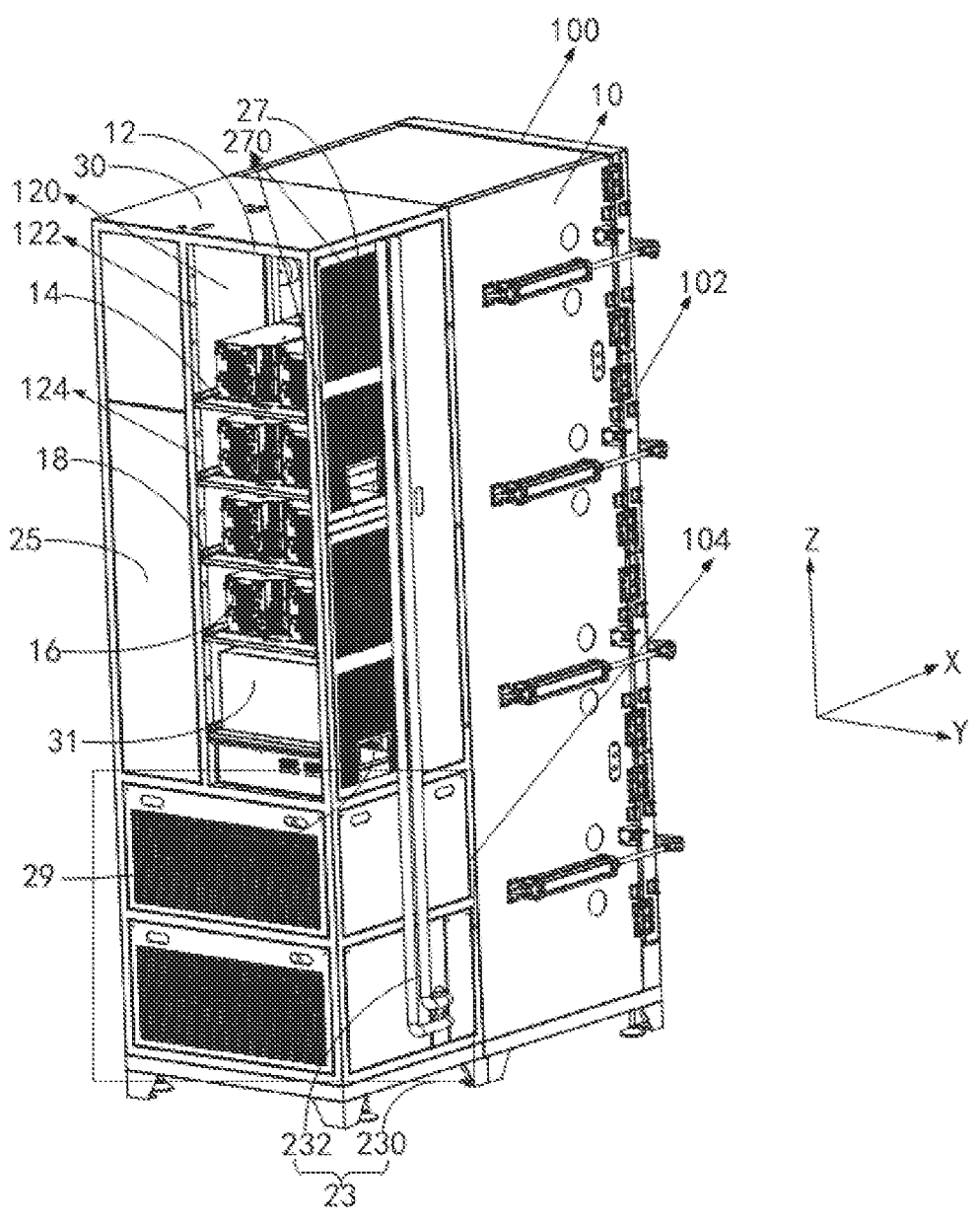
FIG. 1 is a schematic structural diagram of an embodiment of a battery charge and discharge test apparatus according to this application.

Reference signs in specific embodiments are as follows:

temperature control box 10, frame 12, partition 14, charge and discharge module 16, support assembly 18, driving member 11, connecting post 13, connecting terminal 15, first adapter assembly 17, fastener 19, second adapter assembly 20, first detection terminal 22, second detection terminal 24, bearing assembly 26, water collecting tank 28, wire arranging member 21, temperature control module 23, electrical control module 25, cover plate 27, lock fastener 29, sealing plate 30, charging and discharging control module 31, test chamber 100, first side 102, second side 104, door 108, second side wall 101, accommodating chamber 120, fixed position 122, first side wall 124, first end 130 via hole 140, first-type via hole 140*a*, second-type via hole 140*b*, slide 180, first support member 182, second support member 184, first connecting portion 1820, first support portion 1822, second connecting portion 1840, second support portion 1842, first plate 170, second plate 200, condenser assembly 230, return pipe 232, heater 234, fan 236, driving source 238, first bearing member 260, second bearing member 262, restricting member 264, reference position 1000, bearing plate 2600, support plate 2602, and side edge 270.

DESCRIPTION OF EMBODIMENTS

The following clearly and completely describes the technical solutions in the embodiments of this application with reference to the accompanying drawings in the embodiments of this application. Apparently, the described embodiments are only some but not all of the embodiments of this application. All other embodiments obtained by persons of ordinary skill in the art based on the embodiments of this application without creative efforts shall fall within the protection scope of this application.

Unless otherwise defined, all technical and scientific terms used herein shall have the same meanings as commonly understood by persons skilled in the art to which this application belongs. The terms used herein are merely intended to describe the specific embodiments rather than to limit this application. The terms "include", "have", and any other variations thereof in the specification, the claims, and the foregoing brief description of drawings of this application are intended to cover non-exclusive inclusions.

In the descriptions of the embodiments of this application, the terms "first", "second", and the like are merely intended to distinguish between different objects, and shall not be understood as any indication or implication of relative importance or any implicit indication of the number, specific sequence, or primary-secondary relationship of the technical features indicated. In the descriptions of the embodiments of this application, "a plurality of" means more than two, unless otherwise specifically defined.

In this specification, reference to "embodiment" means that specific features, structures, or characteristics described with reference to the embodiment may be incorporated in at least one embodiment of this application. The word "embodiment" appearing in various places in the specification does not necessarily refer to the same embodiment or an independent or alternative embodiment that is exclusive of other embodiments. Persons skilled in the art explicitly and implicitly understand that the embodiments described herein may be combined with other embodiments.

In the descriptions of the embodiments of this application, the term "and/or" is only an associative relationship for describing associated objects, indicating that three relationships may be present. For example, A and/or B may indicate the following three cases: presence of only A, presence of both A and B, and presence of only B. In addition, the character "/" in this specification generally indicates an "or" relationship between the contextually associated objects.

In the descriptions of the embodiments of this application, the term "a plurality of" means more than two (inclusive). Similarly, "a plurality of groups" means more than two (inclusive) groups, and "a plurality of pieces" means more than two (inclusive) pieces.

In the descriptions of the embodiments of this application, the orientations or positional relationships indicated by the technical terms "center", "longitudinal", "transverse", "length", "width", "thickness", "upper", "lower", "front", "rear", "left", "right", "perpendicular", "horizontal", "top", "bottom", "inside", "outside", "clockwise", "counterclockwise", "axial", "radial", "circumferential", and the like are based on the orientations or positional relationships as shown in the accompanying drawings. These terms are merely for ease and brevity of description of the embodiments of this application rather than indicating or implying that the apparatuses or elements mentioned must have specific orientations or must be constructed or manipulated according to specific orientations, and therefore shall not be construed as any limitations on the embodiments of this application.

In the descriptions of the embodiments of this application, unless otherwise specified and defined explicitly, the technical terms "mount", "connect", "join", and "fasten" should be understood in their general senses. For example, they may refer to a fixed connection, a detachable connection, or an integral connection, may refer to a mechanical connection or electrical connection, and may refer to a direct connection, an indirect connection via an intermediate medium, an internal communication between two elements, or an interaction between two elements. Persons of ordinary skill in the art can understand specific meanings of these terms in the embodiments of this application as appropriate to specific situations.

Currently, batteries have been widely used in energy storage power supply systems such as hydroelectric power plants, thermal power plants, wind power plants, and solar power plants, and many other fields including electric transportation tools such as electric bicycles, electric motorcycles, and electric vehicles, military equipment, and aerospace. With continuous expansion of application fields of batteries, market demands for the batteries are also expanding.

During charging and discharging of the battery, the battery cell may swell and thus affects safety performance of the battery. In addition, with the charge and discharge cycles of the battery, the electrolyte is continuously consumed, which affects service life of the battery. Therefore, after battery is manufactured, it is necessary to use a battery charge and discharge test apparatus to test the performance of the battery, especially the charging and discharging stability of the battery at different temperatures.

The inventors of this application have noted that an existing battery charge and discharge test apparatus generally includes a temperature control box and a charge and discharge module, and the temperature control box and the charge and discharge module are separately placed on two different surfaces in a laboratory. Before the test, the temperature control box and the charge and discharge module separately placed need to be placed together first. It can be learned that in the existing battery charge and discharge test apparatus, effective integration between the temperature control box and the charge and discharge module and the like has not been fully considered, and therefore the existing battery charge and discharge test apparatus has the problem of occupying a large space.

Figure 2:
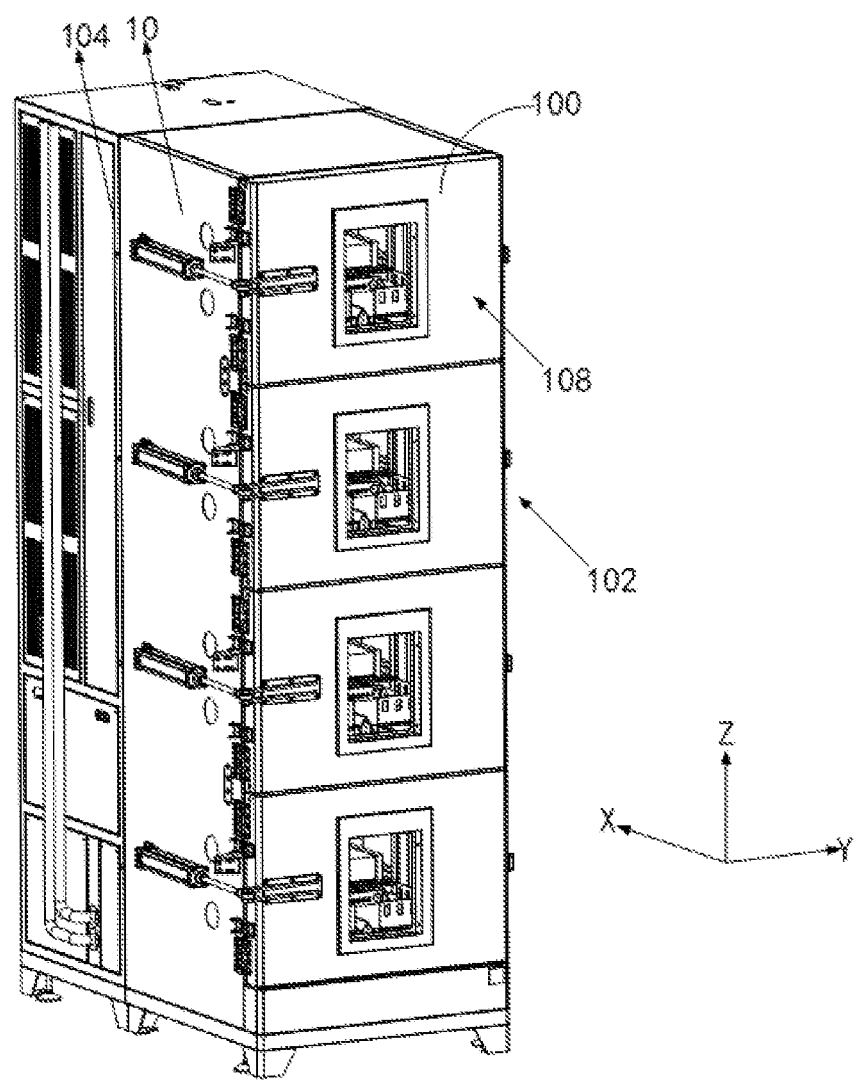
FIG. 2 is a schematic structural diagram of the battery charge and discharge test apparatus in FIG. 1 from another perspective.

To solve the foregoing technical problem, referring to FIG. 1, FIG. 1 is a schematic structural diagram of an embodiment of a battery charge and discharge test apparatus according to this application. The battery charge and discharge test apparatus specifically includes a temperature control box 10, a frame 12, at least one partition 14, and a plurality of charge and discharge modules 16. Specifically, as shown in FIG. 2, FIG. 2 is a schematic structural diagram of the battery charge and discharge test apparatus in FIG. 1 from another perspective. The temperature control box 10 is provided with a plurality of test chambers 100. For example, FIG. 2 schematically shows only four test chambers 100. It can be learned that in other embodiments, the number of the test chambers 100 may be different, which is not limited in this application. The temperature control box 10 includes a first side 102 and a second side 104 opposite each other, and openings (not shown in the figure) are provided on the first side 102 of the temperature control box 10 for communicating with the test chambers 100 respectively and for taking and placing batteries. Still referring to FIG. 1, the frame 12 is disposed adjacent to the second side 104 of the temperature control box 10, and the at least one partition 14 is located inside the frame 12 to partition the frame 12 into a plurality of accommodating chambers 120. For example, FIG. 1 schematically shows only four partitions 14 and five accommodating chambers 120 partitioned by the four partitions 14. It can be learned that in other embodiments, the numbers of partitions 14 and accommodating chambers 120 may be different, which is not limited in this application. The plurality of charge and discharge modules 16 are disposed in the plurality of accommodating chambers 120 respectively and configured to charge and discharge the batteries in the corresponding test chambers 100.

The temperature control box 10 may also be referred to as a high-low temperature box. The test chamber 100 is a chamber used to bear to-be-tested batteries, and the to-be-tested batteries can undergo the charge and discharge test in the test chamber 100. When the batteries are located in the test chamber 100 and undergo charging and discharging, temperature in the test chamber 100 can be maintained at a predetermined temperature. The predetermined temperature may exceed room temperature, for example, 40° C. and 50° C. Alternatively, the predetermined temperature may be lower than room temperature, for example, 0° C. and −10° C. The temperature in the test chamber 100 may be specifically set according to test requirements.

Generally, as shown in FIG. 2, to maintain the temperature in the test chamber 100 at the predetermined temperature during the test, a door 108 is provided at a position of the first side 102 of the temperature control box 10 corresponding to the opening, and the door 108 is pivotally connected to the position corresponding to the opening. When the batteries need to be placed into the test chamber 100, the door 108 can be separated from the opening. After the batteries are placed into the test chamber 100, the door 108 can be used to block the opening to close the test chamber 100.

The first side 102 and the second side 104 being opposite each other in the temperature control box 10 means that if the first side 102 is regarded as the front of the temperature control box 10, the second side 104 can be regarded as the back of the temperature control box 10. In other words, the frame 12 is disposed adjacent to the back of the temperature control box 10.

As shown in FIG. 1, the temperature control box 10 and the frame 12 each includes a thickness direction X, width direction Y, and height direction Z perpendicular to each other. The thickness direction X of the temperature control box 10 is parallel to the thickness direction X of the frame 12, the width direction Y of the temperature control box 10 is parallel to the width direction Y of the frame 12, the height direction Z of the temperature control box 10 is parallel to the height direction Z of the frame 12, and the thickness direction X may be parallel to a direction from the first side 102 to the second side 104. There may be a plurality of arrangement manners of the plurality of accommodating chambers 120 partitioned by the partition 14 inside the frame 12. For example, as shown in FIG. 1, the plurality of accommodating chambers 120 may be sequentially arranged along the height direction Z of the temperature control box 10, in other words, arranged in only one row along the width direction Y of the temperature control box 10. Certainly, in other embodiments, the plurality of accommodating chambers 120 may be arranged in a plurality of rows along the width direction Y of the temperature control box 10, which is not limited in this application.

The charge and discharge module 16 is a mechanism that can provide a charge and discharge current to the to-be-tested batteries. The foregoing "the plurality of charge and discharge modules 16 are disposed in the plurality of accommodating chambers 120 respectively and configured to charge and discharge the batteries in the corresponding test chambers 100" can be understood as follows: at least one charge and discharge module 16 may be disposed in one accommodating chamber 120, and at least some of the charge and discharge modules 16 may be configured to be electrically connected to the batteries in at least one test chamber 100. Preferably, one accommodating chamber 120 is provided with one charge and discharge module 16, and one charge and discharge module 16 is configured to be electrically connected to the batteries in one test chamber 100.

In the foregoing design manner, space on the back (that is, the second side 104) of the temperature control box 10 can be fully used to integrate the charge and discharge modules 16 and the temperature control box 10 as a whole, with no need for additional space to place the charge and discharge modules 16, thereby improving utilization of laboratory space. In addition, in the foregoing design manner, the plurality of accommodating chambers 120 partitioned by the partition 14 and the frame 12 are used to place the plurality of charge and discharge modules 16, which can standardize the arrangement of the plurality of charge and discharge modules 16 and avoid mutual squeeze when adjacent charge and discharge modules 16 are stacked, thereby improving service life of the charge and discharge modules 16.

In some embodiments, as shown in FIG. 1, the frame 12 includes a plurality of fixed positions 122 spaced apart from each other, and the partition 14 is detachably connected to the fixed position 122 so that volume of the accommodating chamber 120 can be changed by changing a fixed position of the partition 14 relative to the frame 12.

For example, as shown in FIG. 1, the plurality of accommodating chambers 120 may be sequentially arranged along the height direction Z. In this case, in the height direction Z, the frame 12 includes the plurality of fixed positions 122 spaced apart from each other. A height of the accommodating chamber 120 in the height direction Z can be changed by changing the position of the partition 14, so as to change the volume of the accommodating chamber 120. Optionally, in the height direction Z, the plurality of fixed positions 122 may be arranged at equal intervals so as to reduce difficulty of process preparation.

In the foregoing design manner, the volume of the accommodating chamber 120 can be adjusted adaptively according to volume of the charge and discharge module 16, so as to improve applicability of the battery charge and discharge test apparatus.

Optionally, the fixed position 122 includes a threaded hole, and the partition 14 may be detachably fastened to the fixed position 122 by using screws or the like. Such design manner is simple and easy for assembly.

Optionally, the frame 12 includes two first side walls 124 opposite each other, where each of the first side walls 124 is provided with a plurality of fixed positions 122, and the partition 14 is bridged between the two first side walls 124 via the fixed positions 122 on the two first side walls 124. For example, one fixed position 122 on one first side wall 124 and one fixed position 122 on the other first side wall

124 form a fixed position group (not marked), and the partition 14 is bridged between the two first side walls 124 via one fixed position group. In this embodiment, when the plurality of accommodating chambers 120 are sequentially arranged along the height direction Z, the two first side walls 124 may be two side walls opposite each other in the width direction Y, and the fixed positions 122 in one fixed position group have a same distance to the horizontal plane in the height direction Z, so that the partition 14 is parallel to the horizontal plane. The foregoing design manner is simple and has a good fastening effect on the partition 14.

Figure 3:
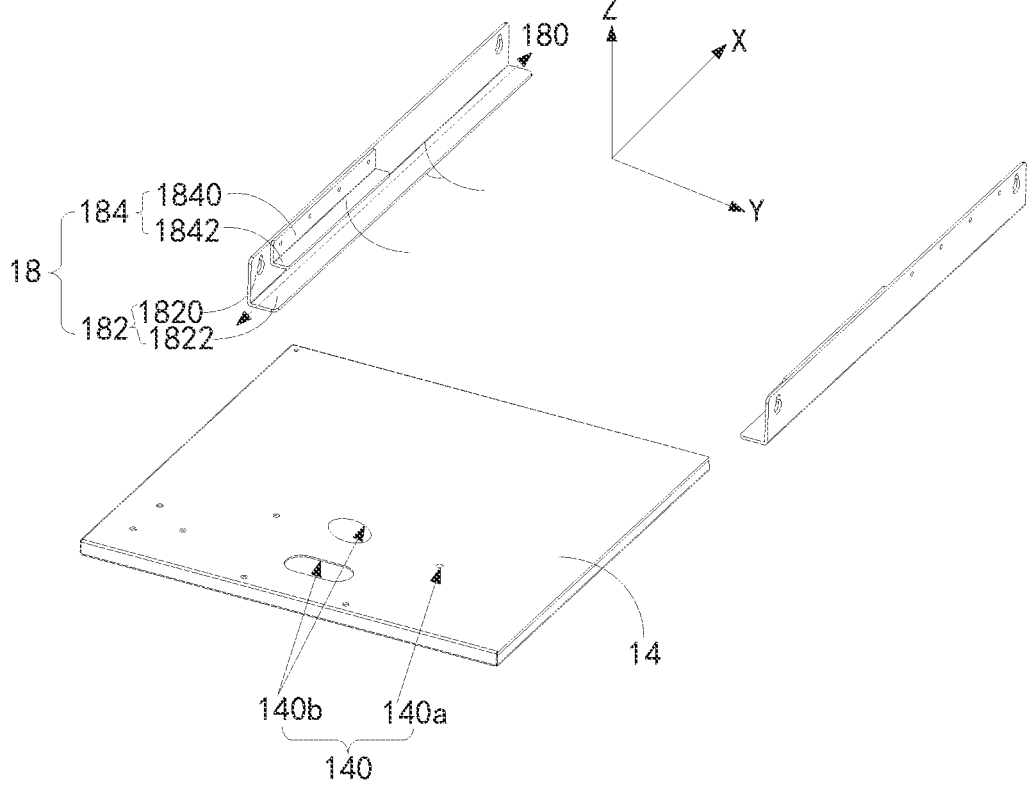
FIG. 3 is a schematic structural diagram of an embodiment of a support assembly and a partition in FIG. 1.

In an application scenario, as shown in FIG. 3, FIG. 3 is a schematic structural diagram of an embodiment of a support assembly and the partition in FIG. 1. The battery charge and discharge test apparatus provided in this application further includes a support assembly 18, where the support assembly 18 is detachably connected to the fixed position 122 in FIG. 1, the support assembly 18 forms a slide 180, and the partition 14 can slide along the slide 180.

Optionally, as shown in FIG. 3, an extending direction of the slide 180 formed by the support assembly 18 is parallel to the thickness direction X of the temperature control box 10, that is, the extending direction of the slide 180 is parallel to the direction from the first side 102 to the second side 104 in the temperature control box 10.

Optionally, the support assembly 18 may be detachably fastened to the fixed position 122 by using screws or the like.

In the foregoing design manner, the partition 14 is detachably connected to the frame 12 via the support assembly 18, making the structural design simple; and the support assembly 18 forming the slide 180 can reduce difficulty of taking or placing the partition 14.

Optionally, as shown in FIG. 3, the support assembly 18 includes a first support member 182 and a second support member 184. The first support member 182 includes a first connecting portion 1820 and a first support portion 1822 angled to each other, and the first connecting portion 1820 is detachably connected to the fixed position 122 in FIG. 1. The second support member 184 includes a second connecting portion 1840 and a second support portion 1842 angled to each other. The second connecting portion 1840 and the first connecting portion 1820 are attached to and connected to each other, and the second support portion 1842 and the first support portion 1822 face each other and are spaced apart from each other to form the slide 180. It can be considered that the first support member 182 and the second support member 184 are both L-shaped structures, and the first connecting portion 1820 and the second connecting portion 1840 may be connected to each other by using screws or the like.

The support assembly 18 has a simple structural design and is easy to assemble. Certainly, in other embodiments, the support assembly 18 may have other structural designs. For example, the support assembly 18 may include the first connecting portion 1820, the first support portion 1822, and the second support portion 1842 in the foregoing embodiment, and the first support portion 1822 and the first connecting portion 1820 are fixedly connected and integrally formed.

Further, as shown in FIG. 3, in the direction of gravity of the partition 14, the direction of gravity may be parallel to the height direction Z, the first support portion 1822 is located on a lower side of the partition 14 and supports the partition 14, and the second support portion 1842 is located on an upper side of the partition 14 and restricts the partition 14 along a direction opposite the direction of gravity; and in the extending direction of the slide 180, a length of the second support portion 1842 is less than a length of the first support portion 1822. For example, in the extending direction of the slide 180, the length of the second support portion 1842 is less than half the length of the first support portion 1822.

In the foregoing design manner, the second support portion 1842 in the extending direction of the slide 180 is relatively short, so as to reduce frictional force on the partition 14 when the partition 14 slides along the slide 180, thereby reducing the difficulty of taking or placing the partition 14 on the slide 180.

In addition, still referring to FIG. 1 and FIG. 3, the frame 12 includes two first side walls 124 opposite each other, where each of the first side walls 124 is provided with a plurality of fixed positions 122, and one partition 14 is detachably disposed between the fixed positions 122 on the two first side walls 124 via two opposite support assemblies 18. In such design manner, stability of the partition 14 can be enhanced, and the probability of the partition 14 detaching from the frame 12 can be reduced.

In some embodiments, as shown in FIG. 3, the partition 14 is provided with a plurality of via holes 140 of different specifications, and the charge and discharge module 16 is connected to the partition 14 via at least one of the via holes 140.

Optionally, the at least one of the via holes 140 connecting the charge and discharge module 16 and the partition 14 may be a threaded hole or the like, and the remaining via holes 140 not for connecting may be non-threaded holes or the like.

Optionally, as shown in FIG. 3, the different specifications refer to different shapes and/or sizes. For example, the partition 14 in FIG. 3 may be provided with a plurality of first-type via holes 140a and a plurality of second-type via holes 140b. An average size of the first-type via holes 140a is less than an average size of the second-type via holes 140b, the plurality of first-type via holes 140a may have the same or different specifications, and the plurality of second-type via holes 140b may have the same or different specifications. The first-type via hole 140a may be configured to connect the charge and discharge module 16 and the partition 14. The second-type via hole 140b may be configured for wiring. For example, some wires of the charge and discharge module 16 above the partition 14 may extend into the accommodating chamber 120 below the partition 14 via the second-type via hole 140b. In such design manner, wiring between adjacent charge and discharge modules 16 is easy and regular.

The via hole 140 introduced can well fasten the charge and discharge module 16 and the partition 14 below the charge and discharge module 16, reducing the probability of tilting and misalignment of the charge and discharge module 16.

Figure 4:
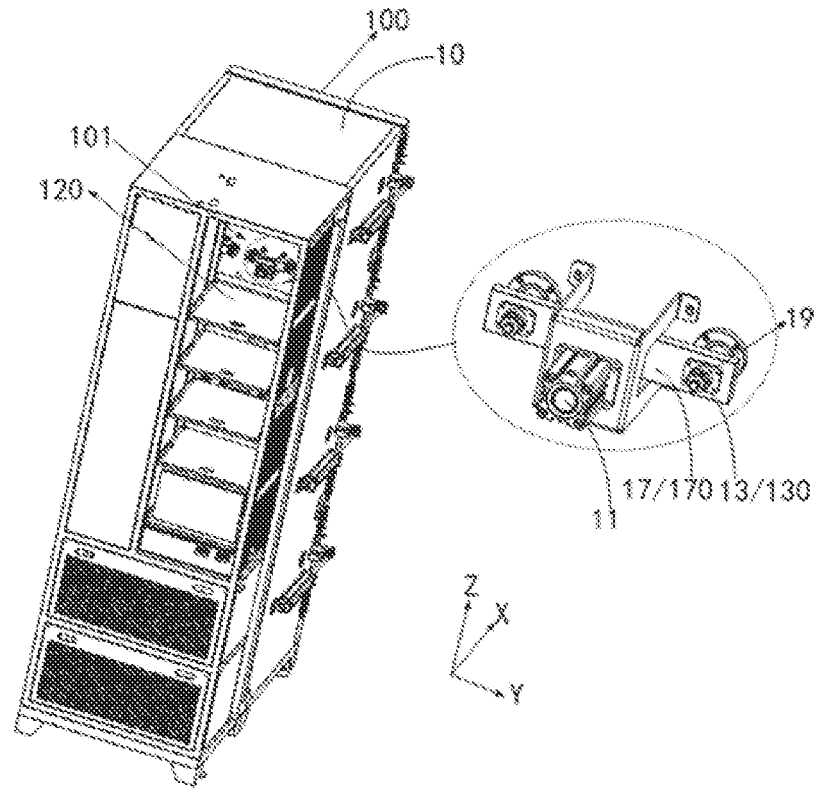
FIG. 4 is a schematic structural diagram of an embodiment of the battery charge and discharge test apparatus in FIG. 1 with charge and discharge modules removed.
Figure 5:
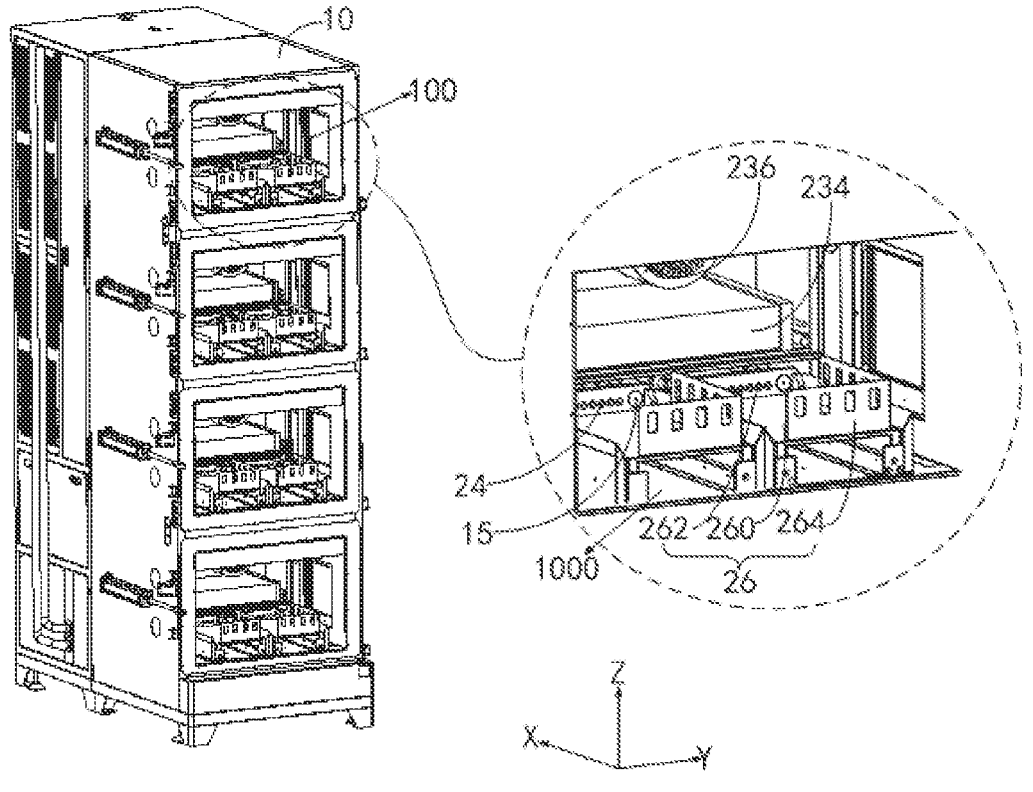
FIG. 5 is a schematic structural diagram of an embodiment of the battery charge and discharge test apparatus in FIG. 1 with door removed.

In some embodiments, as shown in FIG. 4 and FIG. 5, FIG. 4 is a schematic structural diagram of an embodiment of the battery charge and discharge test apparatus in FIG. 1 with charge and discharge modules removed, and FIG. 5 is a schematic structural diagram of an embodiment of the battery charge and discharge test apparatus in FIG. 1 with door removed. The battery charge and discharge test apparatus provided in this application further includes a driving member 11 (as shown in FIG. 4), connecting posts 13 (as shown in FIG. 4), and connecting terminals 15 (as shown in FIG. 5). The driving member 11 is disposed in the accommodating chamber 120, the connecting post 13 is electrically connected to the charge and discharge module 16 (not shown in FIG. 4) and extends from the accommodating chamber 120 through a second side wall 101 of the temperature control box 10 into the test chamber 100, and the connecting terminal 15 is disposed in the test chamber 100 and configured to be electrically connected to the battery. In an axial direction of the connecting post 13, the connecting post 13 and the connecting terminal 15 correspond to each other. The driving member 11 can drive the connecting post 13 to approach the connecting terminal 15 along the axial direction of the connecting post 13 to come into contact with the connecting terminal 15, so that the charge and discharge module 16 charges and discharges the battery when the connecting post 13 is in contact with the connecting terminal 15; and the driving member 11 can drive the connecting post 13 to leave the connecting terminal 15 along the axial direction of the connecting post 13 to separate from the connecting terminal 15.

The driving member 11 may be an air cylinder or the like. The driving member 11 being disposed in the accommodating chamber 120 can be understood that the driving member 11 is located on the second side 104 of the temperature control box 10. The connecting post 13 can be understood as extending into the test chamber 100 after penetrating the second side wall 101 on the second side 104 of the temperature control box 10 from the outside of the temperature control box 10. The connecting post 13 may be a copper post or the like, and the axial direction of the connecting post 13 may be parallel to the thickness direction X of the temperature control box 10. When the battery charge and discharge test needs to be carried out, the driving member 11 can drive the connecting post 13 to approach the connecting terminal 15 under program instructions and the like until the connecting post 13 comes into contact with the connecting terminal 15. Because the charge and discharge module 16 is electrically connected to the connecting post 13 and the connecting terminal 15 is electrically connected to the battery, the charge and discharge current generated by the charge and discharge module 16 can be transferred to the battery via the connecting post 13 and the connecting terminal 15. After the battery charge and discharge test is completed, the driving member 11 can drive the connecting post 13 to leave the connecting terminal 15 under program instructions and the like to separate from the connecting terminal 15, and the battery is electrically disconnected from the charge and discharge module 16.

The foregoing manner of controlling connection and disconnection between the charge and discharge module 16 and the battery via the driving member 11, the connecting post 13, and the connecting terminal 15 is simple and highly automated.

Generally, a battery includes a positive electrode and a negative electrode. Therefore, as shown in FIG. 4, one battery corresponds to two connecting posts 13. The battery charge and discharge test apparatus further includes a first adapter assembly 17, where the two connecting posts 13 are fastened side by side to the first adapter assembly 17, and the driving member 11 is connected to the first adapter assembly 17 and drives the two connecting posts 13 to move synchronously via the first adapter assembly 17.

In the foregoing design manner, the driving member 11 can drive the two connecting posts 13 electrically connected to one battery to move synchronously via the first adapter assembly 17, so as to improve automation control and test efficiency.

Still referring to FIG. 4, the connecting post 13 is penetratedly fastened to the first adapter assembly 17, and the connecting post 13 includes a first end 130 exposed from a side of the first adapter assembly 17 facing away from the test chamber 100. For example, the first adapter assembly 17 includes a first plate 170, and the connecting post 13 may penetrate the first plate 170 and be fixedly connected to the first plate 170. Further, the battery charge and discharge test apparatus further includes a fastener 19 sleeved around the periphery of the first end 130 and pressing a wire (not shown in the figure) between the fastener 19 and the first adapter assembly 17, where the wire is configured to electrically connect the charge and discharge module 16 and the connecting post 13.

Optionally, the fastener 19 may be a fastening screw or the like.

Optionally, a driving end of the driving member 11 may be fixedly connected to the first plate 170 bridged between the two connecting posts 13.

The foregoing manner of electrically connecting the connecting post 13 and the battery charge and discharge module 16 is simple and has high stability.

Figure 6:
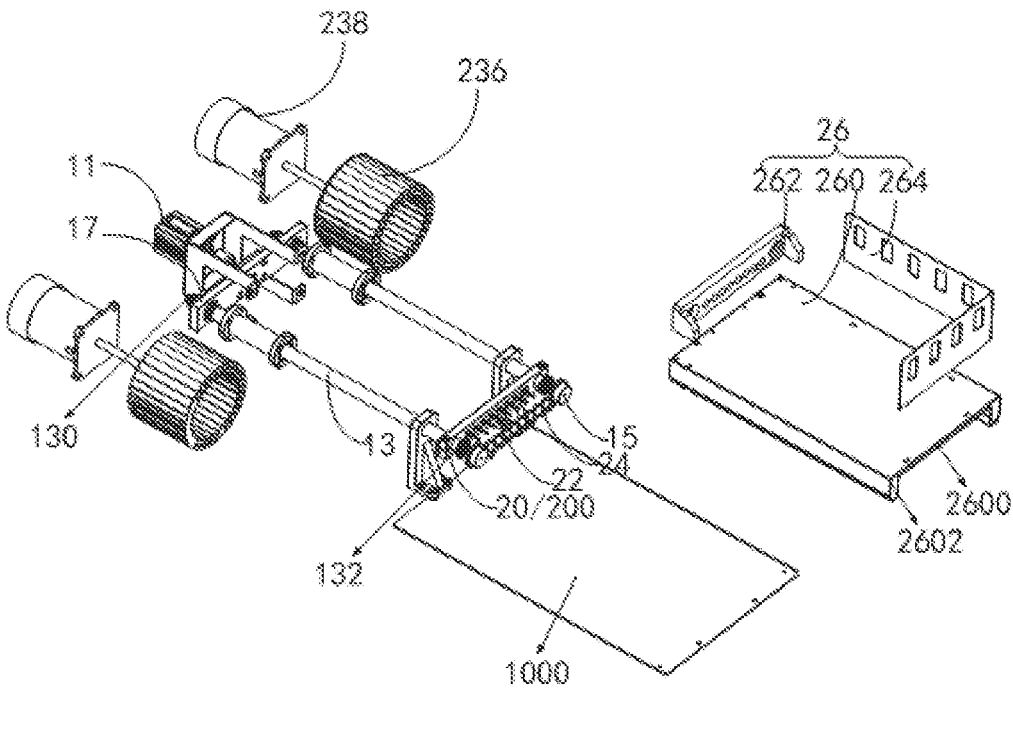
FIG. 6 is a schematic exploded view of an embodiment of some elements inside and outside a test chamber in FIG. 5.

Referring to FIG. 5 and FIG. 6, FIG. 6 is a schematic exploded view of an embodiment of some elements inside and outside the test chamber in FIG. 5. The battery charge and discharge test apparatus provided in this application further includes at least one second adapter assembly 20, first detection terminal 22, and second detection terminal 24 located in the test chamber 100, where the second adapter assembly 20 is bridged between the two connecting posts 13, the first detection terminal 22 is disposed on the second adapter assembly 20, the first detection terminal 22 comes into contact with the second detection terminal 24 as the connecting post 13 approaches the connecting terminal 15, and the first detection terminal 22 separates from the second detection terminal 24 as the connecting post 13 leaves the connecting terminal 15.

Optionally, in the axial direction of the connecting post 13 (parallel to the thickness direction X in the figure), the connecting post 13 includes the first end 130 and a second end 132 opposite each other. The second adapter assembly 20 may include a second plate 200, and second ends 132 of the two connecting posts 13 penetrate the second plate 200. The first detection terminal 22 may be fixedly disposed on a side of the second plate 200 facing away from the first end 130.

Optionally, there may be a plurality of first detection terminals 22 and second detection terminals 24, and the first detection terminals 22 and the second detection terminals 24 are in one-to-one correspondence. The first detection terminal 22 and the second detection terminal 24 may cooperate to achieve functions such as temperature detection and voltage detection.

The second adapter assembly 20 introduced can allow the driving member 11 to drive the plurality of first detection terminals 22 while driving the connecting post 13, so as to improve automation and save driving energy.

Still referring to FIG. 5 and FIG. 6, the battery charge and discharge test apparatus further includes a bearing assembly 26 located in the test chamber 100, where the bearing assembly 26 includes a first bearing member 260 and a second bearing member 262 connected to and angled to each other, the first bearing member 260 is configured to bear the battery, and the connecting terminal 15 and the second detection terminal 24 are disposed on the second bearing member 262.

In the foregoing design manner, the driving member 11 can come into contact with or separate from the connecting terminal 15 and second detection terminal 24 located on the second bearing member 262 while driving the connecting post 13 and the first detection terminal 22, so as to improve the automation.

Optionally, the first bearing member 260 may be fixedly connected to the second bearing member 262 by using screws or the like.

Optionally, as shown in FIG. 5 and FIG. 6, the test chamber 100 includes a reference position 1000. The reference position 1000 is fixedly disposed in the test chamber 100, and may be a fixed plate or the like. The first bearing member 260 is non-fixedly connected to the reference position 1000. The first bearing member 260 includes a bearing plate 2600 and a support plate 2602 connected to and angled to the bearing plate 2600, where the support plate 2602 is disposed between the bearing plate 2600 and the reference position 1000 to form a gap between the bearing plate 2600 and the reference position 1000. The gap facilitates subsequent taking and placing of the bearing assembly 26 in the test chamber 100 by a user.

Optionally, as shown in FIG. 5 and FIG. 6, the bearing assembly 26 further includes a restricting member 264 disposed on a side of the first bearing member 260 facing away from the reference position 1000 and configured to restrict a position of a battery on the first bearing member 260, reducing the probability of the battery sliding out of the first bearing member 260.

Optionally, as shown in FIG. 5, one test chamber 100 may be provided with two reference positions 1000, where one reference position 1000 is provided with one support assembly 18. The support assembly 18 is correspondingly provided with one driving member 11 and two connecting posts 13 in FIG. 4. In other words, one test chamber 100 may accommodate two batteries for charging and discharging at the same time. Certainly, in other embodiments, one test chamber 100 may be provided with only one or more reference positions 1000, which is not limited in this application.

Figure 7:
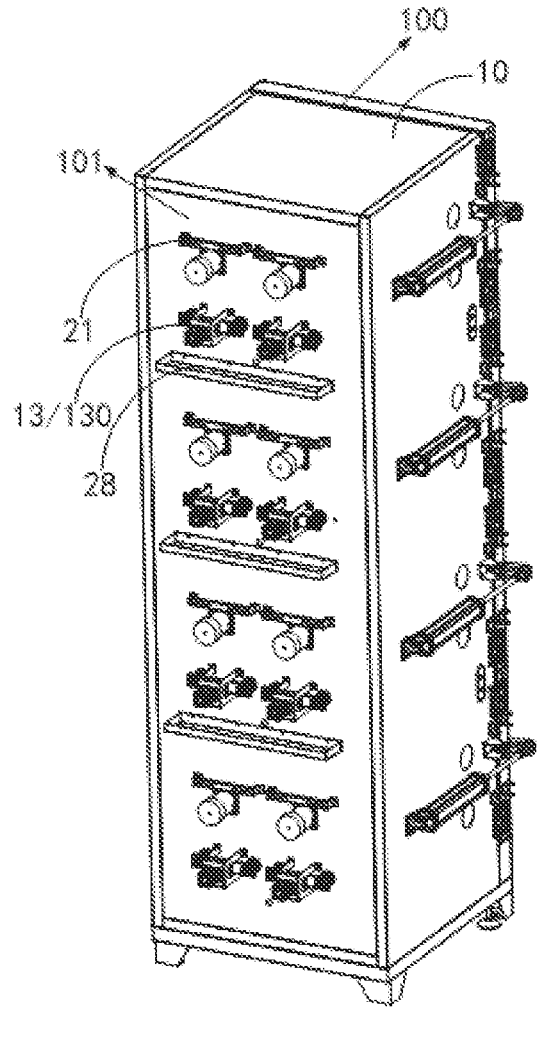
FIG. 7 is a schematic structural diagram of an embodiment of a temperature control box in FIG. 1.

Referring to FIG. 7, FIG. 7 is a schematic structural diagram of an embodiment of the temperature control box in FIG. 1. The battery charge and discharge test apparatus provided in this application further includes a water collecting tank 28, where the water collecting tank 28 is disposed on a side of the second side wall 101 of the temperature control box 10 facing away from the test chamber 100 and located below the connecting post 13. During charging and discharging of the battery, a charge and discharge test below zero degree may need to be carried out for the battery. In this case, condensed water is formed on the first end 130 of the connecting post 13 located outside the test chamber 100 due to the ambient air. The water collecting tank 28 is used to collect the condensed water so as to reduce influence of the condensed water on the wire and the like.

Optionally, as shown in FIG. 7, one test chamber 100 may be correspondingly provided with one water collecting tank 28, and orthographic projections of first ends 130 of four connecting posts 13 in one test chamber 100 on the corresponding water collecting tank 28 are located in the corresponding water collecting tank 28. Such structural design is simple.

Still referring to FIG. 7, the battery charge and discharge test apparatus provided in this application further includes a wire (not shown in the figure) and a wire arranging member 21. The wire is configured to electrically connect the charge and discharge module 16 (not shown in FIG. 7) and the connecting post 13. The wire arranging member 21 is disposed on the side of the second side wall 101 of the temperature control box 10 facing away from the test chamber 100, and the wire penetrates the wire arranging member 21. Optionally, the wire arranging member 21 may be a U-shaped member, and two ends of the U-shaped member are fixedly connected to the second side wall 101.

Optionally, one driving member 11 may be correspondingly provided with one wire arranging member 21.

In the foregoing design manner, the wire arranging member 21 introduced can make regular wiring.

Still referring to FIG. 1, in the height direction Z of the frame 12, the frame 12 includes an upper portion and a lower portion opposite each other. The battery charge and discharge test apparatus provided in this application further includes a temperature control module 23 and an electrical control module 25. The temperature control module 23 is configured to control temperature of the test chamber 100, where at least part of the temperature control module 23 is disposed in the frame 12 and located on the lower portion of the frame 12. The electrical control module 25 is electrically connected to the temperature control module 23 and the charge and discharge module 16, where the electrical control module 25 and the charge and discharge module 16 are disposed on an upper portion of the temperature control module 23, and the electrical control module 25 and the charge and discharge module 16 are disposed side by side along the width direction Y.

Optionally, the electrical control module 25 can be understood as a control cabinet in the general sense, and may include a power distribution box and the like.

Optionally, the temperature control module 23 may include a condenser assembly 230 and a return pipe 232 configured to cool the condenser assembly 230. The condenser assembly 230 is configured to cool the test chamber 100 and may be located at the bottom of the frame 12. Certainly, the temperature control module 23 further includes other components. For example, the temperature control module 23 further includes a heater 234 (as shown in FIG. 5), a fan 236 (as shown in FIG. 5), and a driving source 238 (as shown in FIG. 6) for driving the fan 236 to rotate, where the fan 236 and the heater 234 are located in the test chamber 100, and the heater 234 is configured to heat the test chamber 100. The fan 236 is configured to achieve forced convection of the air in the test chamber 100, so that temperature is uniform at various positions in the test chamber 100. The driving source 238 may be disposed outside the test chamber 100 so as to reduce the space occupied in the test chamber 100.

The temperature control module 23, the electrical control module 25, and the charge and discharge module 16 are all located on the second side 104 of the temperature control box 10, with a reasonable spatial layout and high integration level.

Still referring to FIG. 1, the frame 12 can be understood as being formed by a plurality of pillars connected to each other. A first hollow carved region (not marked) is provided on a side of the frame 12 facing away from the test chamber 100, the charge and discharge module 16 includes an operating interface, and the operating interface is exposed from the first hollow carved region. In such design manner, the testers can easily operate the charge and discharge module 16.

Still referring to FIG. 1, the frame 12 has a second hollow carved region (not marked) on a side of the accommodating chamber 120 facing away from the electrical control module 25, and the battery charge and discharge test apparatus further includes a cover plate 27 configured to cover the second hollow carved region; where the cover plate 27 is provided with a plurality of heat dissipation holes (not marked).

The cover plate 27 introduced can reduce the probability of the wire being exposed from the second hollow carved region, so as to make a good visual effect. In addition, the heat dissipation holes on the cover plate 27 introduced are conducive to heat dissipation of the charge and discharge module 16, thereby improving the service life of the charge and discharge module 16.

Optionally, as shown in FIG. 1, there may be a plurality of cover plates 27, and the plurality of cover plates 27 may cover different regions of the second hollow carved region side by side along the height direction Z.

Optionally, the cover plate 27 includes two side edges 270 opposite each other, with one side edge 270 being pivotally connected to the frame 12 and the other side edge 270 being provided with a lock fastener 29, where the lock fastener 29 is configured to restrict pivot rotation of the cover plate 27 relative to the frame 12 in a locked state. The lock fastener 29 may be a spring-loaded lock, a screw, or the like. The locked state is a temporary fixed state formed by the cover plate 27 relative to the frame 12. When workers find it necessary to replace some elements or check connections of wires and the like, the workers can unlock the lock fastener 29, so that the cover plate 27 rotates relative to the frame 12, facilitating maintenance by the workers.

Certainly, in other embodiments, the cover plate 27 may be pivotally connected to the frame 12 in other manners. For example, in the width direction Y, the cover plate includes a first sub-cover plate and a second sub-cover plate covering different regions of the second hollow carved region side by side. Side edges of the first sub-cover plate and the second sub-cover plate far away from each other are pivotally connected to the frame, and a lock fastener is disposed between side edges of the first sub-cover plate and the second sub-cover plate adjacent to each other. The lock fastener is configured to restrict pivot rotations of both the first sub-cover plate and the second sub-cover plate relative to the frame in the locked state. In other words, a double-door configuration is formed.

Still referring to FIG. 1, a third hollow carved region (not shown in the figure) is provided on a side of the upper portion of the frame 12 facing away from the lower portion, the battery charge and discharge test apparatus further includes a sealing plate 30, and the sealing plate 30 covers at least the third hollow carved region. Optionally, the sealing plate 30 may be made of some waterproof materials. The sealing plate 30 introduced can reduce the probability of external rainwater and the like entering the charge and discharge test apparatus, thereby improving the service life of the charge and discharge test apparatus. Certainly, in other embodiments, the sealing plate 30 may further cover other regions, for example, a top surface of the temperature control box 10 adjacent to the third hollow carved region.

In addition, still referring to FIG. 1, the battery charge and discharge test apparatus may further include a charging and discharging control module 31. The plurality of charge and discharge modules 16 are electrically connected to the charging and discharging control module 31, and the charging and discharging control module 31 can control each charge and discharge module 16 for charging and discharging separately. Optionally, the charging and discharging control module 31 and the plurality of charge and discharge modules 16 may be disposed side by side along the height direction Z. Optionally, the plurality of charge and discharge modules 16 may be electrically connected to the charging and discharging control module 31 in parallel; or the charge and discharge modules 16 farther away from the charging and discharging control module 31 may be electrically connected to the charge and discharge modules 16 closer to the charging and discharging control module 31. In other words, the charge and discharge modules 16 farther away from the charging and discharging control module 31 are electrically connected to the charging and discharging control module 31 via the charge and discharge modules 16 closer to the charging and discharging control module 31.

In addition, it should be noted that the test chamber 100 in the battery charge and discharge test apparatus provided in this application can accommodate batteries with different volumes for the charge and discharge test, and the reference position 1000 in the test chamber 100 can be designed in advance according to the maximum battery volume of various models of to-be-tested batteries. For example, the various models of the to-be-tested batteries include small-sized batteries such as small soft-pack laminated batteries and large-sized batteries with steel shells and the like. The size of the reference position 1000 in the test chamber 100 can be larger than the size of the large-sized batteries, so that one reference position 1000 can be used to test both large-sized and small-sized batteries.

In a specific application scenario, as shown in FIG. 1 and FIG. 2, the battery charge and discharge test apparatus includes a temperature control box 10, a frame 12, at least one partition 14, and a plurality of charge and discharge modules 16. The temperature control box 10 is provided with a plurality of test chambers 100. The temperature control box 10 includes a first side 102 and a second side 104 opposite each other, and openings (not shown in the figure) are provided on the first side 102 of the temperature control box 10 for communicating with the test chambers 100 respectively and for taking and placing batteries. The frame 12 is disposed adjacent to the second side 104 of the temperature control box 10, and the at least one partition 14 is located inside the frame 12 to partition the frame 12 into a plurality of accommodating chambers 120. The plurality of charge and discharge modules 16 are disposed in the plurality of accommodating chambers 120 respectively and configured to charge and discharge the batteries in the corresponding test chambers 100.

The frame 12 being provided with the partition 14 can standardize the arrangement of the charge and discharge modules 16. The frame 12 is uniformly provided with a plurality of threaded holes, the partition 14 is detachably fastened to the frame 12 via the threaded holes, and heights between different partitions 14 are adjusted to accommodate charge and discharge modules 16 of different heights.

Further, the partition 14 is in contact with the frame 12 using the support assembly 18. In this way, the partition 14 can not only be well fastened to the frame 12 but also restrict the position, so as to prevent the charge and discharge module 16 from falling and causing injury to the related personnel due to the partition 14 sliding out. Threaded holes of different sizes or other types of fixing holes can be opened on the partition 14 according to requirements of different charge and discharge modules 16. These holes are configured to fasten the charge and discharge modules 16 to the partition 14, preventing the charge and discharge modules 16 from tipping over.

In addition, a first hollow carved region is provided on a side of the frame 12 facing away from the test chamber 100, the charge and discharge module 16 includes a button and a control interface (that is, the operating interface mentioned above), and the button and the control interface are exposed from the first hollow carved region. The frame 12 is blocked using a hollow mesh door (that is, the cover plate 27) on a side surface of a side of the accommodating chamber 120 facing away from the electrical control module 25, and the hollow mesh door can be locked using screws or spring-loaded locks, so as to ensure that a wiring harnesses on a side surface of the charge and discharge module 16 is not exposed, which does not affect cleanliness of the machine and facilitates the maintenance by the workers. The upper portion of the frame 12 is sealed using the sealing plate 30, which can play a waterproof role, preventing external rain-water and the like from dripping onto the charge and discharge module 16. In addition, the charge and discharge module 16 is connected to the temperature control box 10 using a wiring harness (that is, the wire mentioned above), and the wiring harness is locked to the first adapter assembly 17 via threads.

The foregoing descriptions are merely the embodiments of this application, but are not intended to limit the patent scope of this application. Any equivalent structural or process transformation made by using the content of the specification and accompanying drawings of this application, or direct or indirect application in other related technical fields shall all fall within the patent protection scope of this application in the same way.

The invention claimed is:

1. A battery charge and discharge test apparatus, characterized by comprising:
   a temperature control box, wherein the temperature control box is provided with a plurality of test chambers, and openings are provided on a first side of the temperature control box for communicating with the test chambers respectively and taking and placing batteries;
   a frame and at least one partition, wherein the frame is disposed adjacent to a second side of the temperature control box, and the at least one partition is located inside the frame to partition the frame into a plurality of accommodating chambers; the first side and the second side being opposite each other;
   a plurality of charge and discharge modules, wherein the plurality of charge and discharge modules are disposed in the plurality of accommodating chambers respectively and configured to charge and discharge the batteries in corresponding test chambers; and
   a driving member, connecting posts, and connecting terminals, wherein the driving member is disposed in the accommodating chamber, the connecting post is electrically connected to the charge and discharge module and extends from the accommodating chamber through a side wall of the temperature control box into the test chamber, and the connecting terminal is disposed in the test chamber and configured to be electrically connected to the battery; and in an axial direction of the connecting post, the connecting post and the connecting terminal correspond to each other, the driving member is able to drive the connecting post to approach the connecting terminal along the axial direction of the connecting post to come into contact with the connecting terminal, and the driving member is able to drive the connecting post to leave the connecting terminal along the axial direction of the connecting post to separate from the connecting terminal.

2. The battery charge and discharge test apparatus according to claim 1, wherein,
   the frame comprises a plurality of fixed positions spaced apart from each other, and the partition is detachably connected to the fixed position so that volume of the accommodating chamber is changeable by changing a fixed position of the partition relative to the frame.

3. The battery charge and discharge test apparatus according to claim 2, further comprising:

a support assembly, wherein the support assembly is detachably connected to the fixed position, the support assembly forms a slide, and the partition is able to slide along the slide.

4. The battery charge and discharge test apparatus according to claim 3, wherein, the support assembly comprises a first support member and a second support member; and, wherein the first support member comprises a first connecting portion and a first support portion angled to each other, and the first connecting portion is detachably connected to the fixed position; and the second support member comprises a second connecting portion and a second support portion angled to each other; wherein the second connecting portion and the first connecting portion are attached to and connected to each other, and the second support portion and the first support portion face each other and are spaced apart from each other to form the slide.

5. The battery charge and discharge test apparatus according to claim 4, wherein, in a direction of gravity of the partition, the first support portion is located on a lower side of the partition and supports the partition, and the second support portion is located on an upper side of the partition and restricts the partition along a direction opposite the direction of gravity; and in an extending direction of the slide, a length of the second support portion is less than a length of the first support portion.

6. The battery charge and discharge test apparatus according to claim 3, wherein, the partition is provided with a plurality of via holes of different specifications, and the charge and discharge module is connected to the partition via at least one of the via holes.

7. The battery charge and discharge test apparatus according to claim 3, wherein, a first hollow carved region is provided on a side of the frame facing away from the test chamber, the charge and discharge module comprises an operating interface, and the operating interface is exposed from the first hollow carved region.

8. The battery charge and discharge test apparatus according to claim 2, wherein, the fixed position comprises a threaded hole; and/or the frame comprises two side walls opposite each other, wherein each of the side walls is provided with a plurality of fixed positions, one fixed position on one side wall and one fixed position on the other side wall form a fixed position group, and the partition is bridged between the two side walls via one fixed position group.

9. The battery charge and discharge test apparatus according to claim 1, wherein, a number of the connecting posts is two, and the battery charge and discharge test apparatus further comprises a first adapter assembly; wherein the two connecting posts are fastened side by side to the first adapter assembly, and the driving member is connected to the first adapter assembly and drives the two connecting posts to move synchronously via the first adapter assembly.

10. The battery charge and discharge test apparatus according to claim 9, wherein, the connecting post is penetratedly fastened to the first adapter assembly, and the connecting post comprises a first end exposed from a side of the first adapter assembly facing away from the test chamber; and the battery charge and discharge test apparatus further comprises:

a fastener sleeved around a periphery of the first end and pressing a wire between the fastener and the first adapter assembly, wherein the wire is configured to electrically connect the charge and discharge module and the connecting post.

11. The battery charge and discharge test apparatus according to claim 9, further comprising at least one second adapter assembly, first detection terminal, and second detection terminal located in the test chamber, wherein the second adapter assembly is bridged between the two connecting posts, the first detection terminal is disposed on the second adapter assembly, the first detection terminal comes into contact with the second detection terminal as the connecting post approaches the connecting terminal, and the first detection terminal separates from the second detection terminal as the connecting post leaves the connecting terminal.

12. The battery charge and discharge test apparatus according to claim 11, wherein, the battery charge and discharge test apparatus further comprises:

a bearing assembly located in the test chamber, wherein the bearing assembly comprises a first bearing member and a second bearing member connected to and angled to each other, the first bearing member is configured to bear the battery, and the connecting terminal and the second detection terminal are disposed on the second bearing member.

13. The battery charge and discharge test apparatus according to claim 1, further comprising a water collecting tank, wherein the water collecting tank is disposed on a side of the side wall of the temperature control box facing away from the test chamber and located below the connecting post.

14. The battery charge and discharge test apparatus according to claim 13, characterized by further comprising:

a wire configured to electrically connect the charge and discharge module and the connecting post; and a wire arranging member, wherein the wire arranging member is disposed on the side of the side wall of the temperature control box facing away from the test chamber, and the wire penetrates the wire arranging member.

15. The battery charge and discharge test apparatus according to claim 1, wherein, the frame comprises a thickness direction, width direction, and height direction perpendicular to each other, and the thickness direction is parallel to a direction from the first side to the second side; wherein in the height direction of the frame, the frame comprises an upper portion and a lower portion opposite each other; and the battery charge and discharge test apparatus further comprises:

a temperature control module configured to control temperature of the test chamber, wherein at least part of the temperature control module is disposed in the frame and located on the lower portion of the frame; and an electrical control module electrically connected to the temperature control module and the charge and discharge module, wherein the electrical control module and the charge and discharge module are disposed on an upper portion of the temperature control module, and the electrical control module and the charge and discharge module are disposed side by side along the width direction.

16. The battery charge and discharge test apparatus according to claim 15, wherein, the frame has a second hollow carved region on a side of the accommodating chamber facing away from the electrical control module, and the battery charge and discharge test apparatus further comprises a cover plate configured to cover the second hollow carved region; wherein the cover plate is provided with a plurality of heat dissipation holes.

17. The battery charge and discharge test apparatus according to claim 16, wherein, the cover plate comprises two side edges opposite each other, with one side edge being pivotally connected to the frame and the other side edge being provided with a lock fastener, wherein the lock fastener is configured to restrict pivot rotation of the cover plate relative to the frame in a locked state.

18. The battery charge and discharge test apparatus according to claim 15, wherein, a third hollow carved region is provided on a side of the upper portion of the frame facing away from the lower portion, the battery charge and discharge test apparatus further comprises a sealing plate, and the sealing plate covers at least the third hollow carved region.

*    *    *    *    *